(12) United States Patent
You

(10) Patent No.: US 12,402,500 B2
(45) Date of Patent: Aug. 26, 2025

(54) DISPLAY DEVICE WITH DUAL-LAYER VOLTAGE TRANSMITTING LINES

(71) Applicant: Samsung Display Co., Ltd., Yongin-Si (KR)

(72) Inventor: Chun Gi You, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 502 days.

(21) Appl. No.: 17/560,725

(22) Filed: Dec. 23, 2021

(65) Prior Publication Data

US 2022/0310773 A1    Sep. 29, 2022

(30) Foreign Application Priority Data

Mar. 23, 2021    (KR) ........................ 10-2021-0037417

(51) Int. Cl.
*H10K 59/131* (2023.01)
(52) U.S. Cl.
CPC ................................ *H10K 59/1315* (2023.02)
(58) Field of Classification Search
CPC .......................... H10K 59/1315; H10K 59/131
See application file for complete search history.

(56) References Cited

U.S. PATENT DOCUMENTS

| 10,909,930 | B2* | 2/2021 | Kim ..................... H10K 59/131 |
| 2016/0322453 | A1* | 11/2016 | Park ..................... H10K 59/124 |
| 2020/0083306 | A1* | 3/2020 | Choi ..................... H10K 59/124 |

FOREIGN PATENT DOCUMENTS

| KR | 10-0169390 B1 | 1/1999 |
| KR | 2019-0128030 A | 11/2019 |
| KR | 10-2062735 B1 | 1/2020 |
| KR | 2020-0116568 A | 10/2020 |

OTHER PUBLICATIONS

Definition of "some", retrieved from http://www.merriam-webster.com (2024) (Year: 2024).*

* cited by examiner

*Primary Examiner* — Michele Fan
(74) *Attorney, Agent, or Firm* — Innovation Counsel LLP

(57) ABSTRACT

A display device according to an embodiment includes: a substrate including a display area for displaying images and a non-display area disposed around the display area; a plurality of connection lines disposed in the non-display area of the substrate and connected to the display area of the substrate; and a voltage transmitting line disposed in the non-display area of the substrate and transmitting a signal to the display area of the substrate, wherein the voltage transmitting line may include a first layer and a second layer overlapping each other in a depthdirection that is perpendicular to a surface of the substrate, the first layer may not overlap the connection lines in the depth direction, and the second layer may overlap some of the connection lines in the depth direction.

20 Claims, 13 Drawing Sheets

DISPLAY DEVICE WITH DUAL-LAYER VOLTAGE TRANSMITTING LINES

CROSS-REFERENCE TO RELATED APPLICATION

This application claims priority to and benefit of Korean Patent Application No. 10-2021-0037417 filed in the Korean Intellectual Property Office on Mar. 23, 2021, the entire content of which is incorporated herein by reference.

BACKGROUND

1. Field

The present disclosure relates to a display device.

2. Description of the Related Art

A flat panel display includes a liquid crystal display (LCD), a plasma display panel (PDP), an organic light emitting diode device (OLED device), a field effect display (FED), and an electrophoretic display device.

To increase a screen-to-body ratio of the display device, that is, a ratio by which the screen occupies the display device when the display device is seen from the front, efforts for reducing a width of a non-display area disposed around the display area are made.

Further, a signal line for transmitting signals to the display device may be damaged by static electricity that may be generated during a display device manufacturing process.

SUMMARY

The described technology has been made in an effort to provide a display device for preventing damages caused by static electricity while reducing a width of a non-display area of the display device.

The objects of the embodiments are not limited to the above-described object, and it may be expanded in various ways in the range of the ideas and the areas of the embodiments.

An embodiment provides a display device including: a substrate including a display area for displaying images and a non-display area disposed around the display area; a plurality of connection lines disposed in the non-display area of the substrate and connected to the display area of the substrate; and a voltage transmitting line disposed in the non-display area of the substrate and transmitting a signal to the display area of the substrate, wherein the voltage transmitting line may include a first layer and a second layer overlapping each other in a depth direction that is perpendicular to a surface of the substrate, the first layer may not overlap the connection lines in the depth direction, and the second layer may overlap some of the connection lines in the depth direction.

The voltage transmitting line may be disposed to surround the display area in the non-display area.

The first layer of the voltage transmitting line may include a first portion and a second portion spaced from each other.

The second layer of the voltage transmitting line may overlap the first portion and the second portion, and the second layer may be spaced from both the first portion and the second portion in the depth direction.

A width of the second layer of the voltage transmitting line may be greater than a width of the first layer of the voltage transmitting line.

The display device may further include: a semiconductor layer disposed in the display area; a gate electrode overlapping the semiconductor layer; a source electrode and a drain electrode connected to the semiconductor layer; and a data line connected to the source electrode, wherein the connection lines may be on a same layer as the gate electrode.

The first layer of the voltage transmitting line may be made of the same layer as the source electrode and the drain electrode.

The second layer of the voltage transmitting line may be on the same layer as the data line.

The display device may further include: a first voltage transmitting line disposed in the non-display area and transmitting a signal that is different from that of the voltage transmitting line to the display area of the substrate, wherein the first voltage transmitting line may be on the same layer as the data line.

The first voltage transmitting line may include a first sub-layer that is on the same layer as the source electrode and the drain electrode and a second sub-layer that is on the same layer as the data line.

Another embodiment provides a display device including: a substrate including a display area for displaying images and a non-display area disposed around the display area; a plurality of connection lines disposed in the non-display area of the substrate and connected to the display area of the substrate; and a voltage transmitting line disposed in the non-display area of the substrate and transmitting a signal to the display area of the substrate, wherein the voltage transmitting line may include a first region not overlapping the connection lines in a depth direction that is perpendicular to a surface of the substrate and a second region overlapping some of the connection lines.

The voltage transmitting line may include a first layer and a second layer overlapping each other in a depth direction that is perpendicular to the surface of the substrate, and the depth region may include a first sub-region in which the first layer overlaps the second layer in the depth direction and a second sub-region in which the first layer does not overlap the second layer.

The voltage transmitting line may include a first layer and a second layer overlapping in a depth direction that is perpendicular to the surface of the substrate, and the second layer may be disposed in the second region.

According to the display device according to the embodiments, the width of the non-display area of the display device may be reduced, and the damage caused by static electricity may be prevented.

The effects of the embodiments are not limited to the above-described effects, and it may be expanded in various ways in the range of the ideas and the areas of the embodiments.

DETAILED DESCRIPTION

Figure 1:
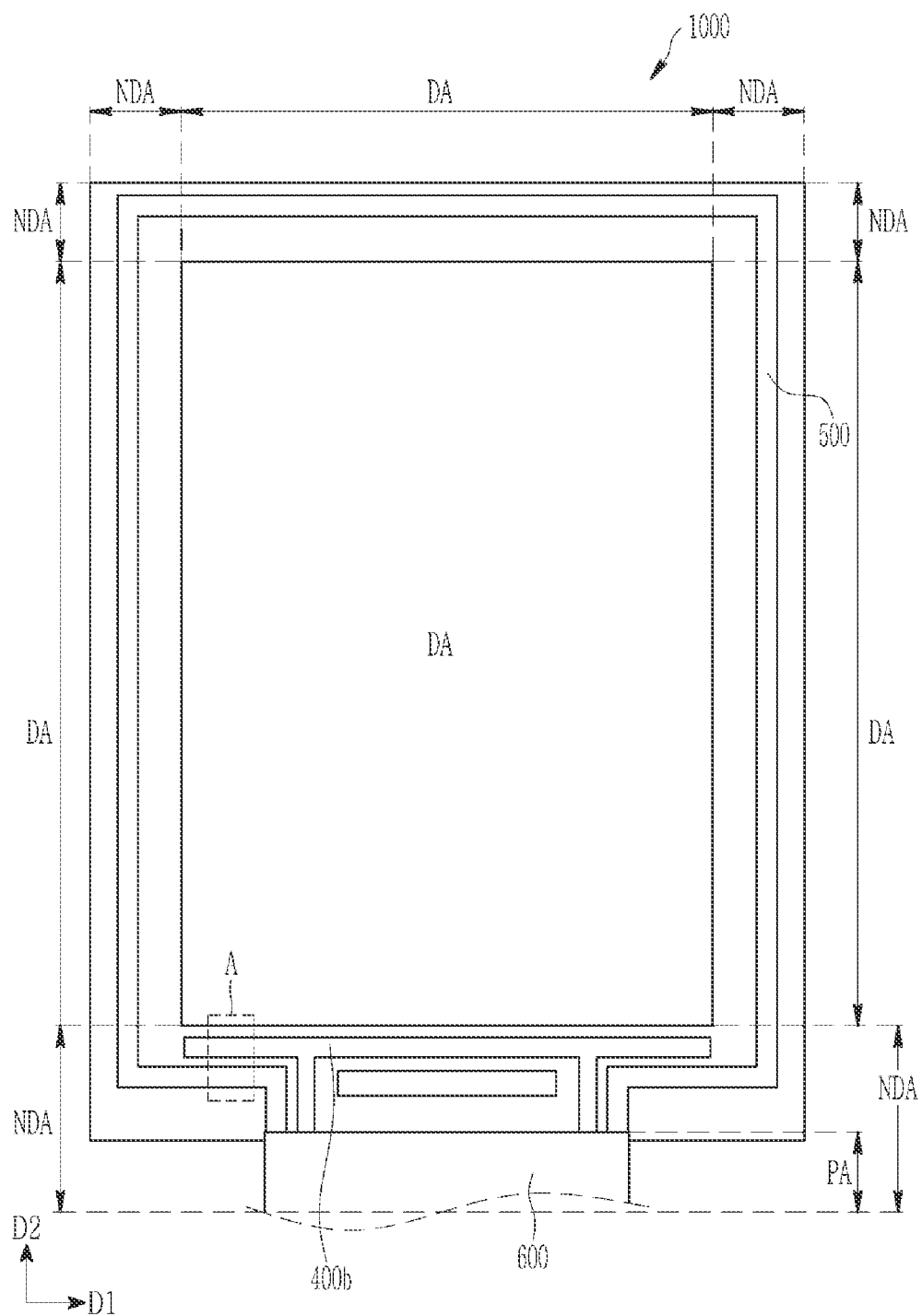
FIG. 1 shows a top plan view of a display device according to an embodiment.

The embodiments will be described more fully hereinafter with reference to the accompanying drawings, in which the embodiments are shown. As those skilled in the art would realize, the described embodiments may be modified in various different ways, all without departing from the spirit or scope of the embodiments.

The drawings and description are to be regarded as illustrative in nature and not restrictive, and like reference numerals designate like elements throughout the specification.

Size and thickness of each configuration shown in the drawings are arbitrarily shown for better understanding and ease of description, but the embodiments is not limited thereto. In the drawings, the thickness of layers, films, panels, regions, etc., are exaggerated for clarity. For better understanding and ease of description, the thicknesses of some layers and areas are exaggerated.

It will be understood that when an element such as a layer, film, region, or substrate is referred to as being "on" another element, it can be directly on the other element or intervening elements may be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

Throughout the specification, when it is described that a part is "connected (in contact with, coupled)" to another part, the part may be "directly connected" to the other element, may be "connected" to the other part through a third part, or may be connected to the other part physically or electrically, and they may be referred to by different titles depending on positions or functions, but respective portions that are substantially integrated into one body may be connected to each other.

A display device according to an embodiment will now be described with reference to FIG. 1. FIG. 1 shows a top plan view of a display device according to an embodiment.

Referring to FIG. 1, the display device 1000 includes a plurality of pixels, and includes a display area DA for displaying images and a non-display area NDA disposed on an outside of the display area DA.

The non-display area NDA includes a driving area PA in which a driver 600 for transmitting signals to the display area DA is disposed. For example, an external device such as a driving chip may be mounted in the driving area PA, or the external device may be connected thereto through a flexible circuit board.

A first voltage transmitting line 400 and a second voltage transmitting line 500 for transmitting driving voltages are disposed in the non-display area NDA. Pad electrodes electrically connected to the external device and a plurality of connection lines connected thereto may be disposed in the non-display area NDA. The connection lines may receive a data signal, a scan signal, an emission signal, a power voltage, and a touch sensing signal from the driving area PA, and may transmit them to the display area DA. The connection lines may represent a fan out portion.

According to the shown embodiment, the first voltage transmitting line 400 extends in a first direction D1, and the second voltage transmitting line 500 starts from the driver 600 and surrounds the display area DA along the non-display area NDA. This particular embodiment is an example, and dispositions of the first voltage transmitting line 400 and the second voltage transmitting line 500 is not limited to what is depicted in FIG. 1.

Although not shown, the driving area PA may be disposed on respective sides of the display area DA in the second direction D2.

Figure 2:
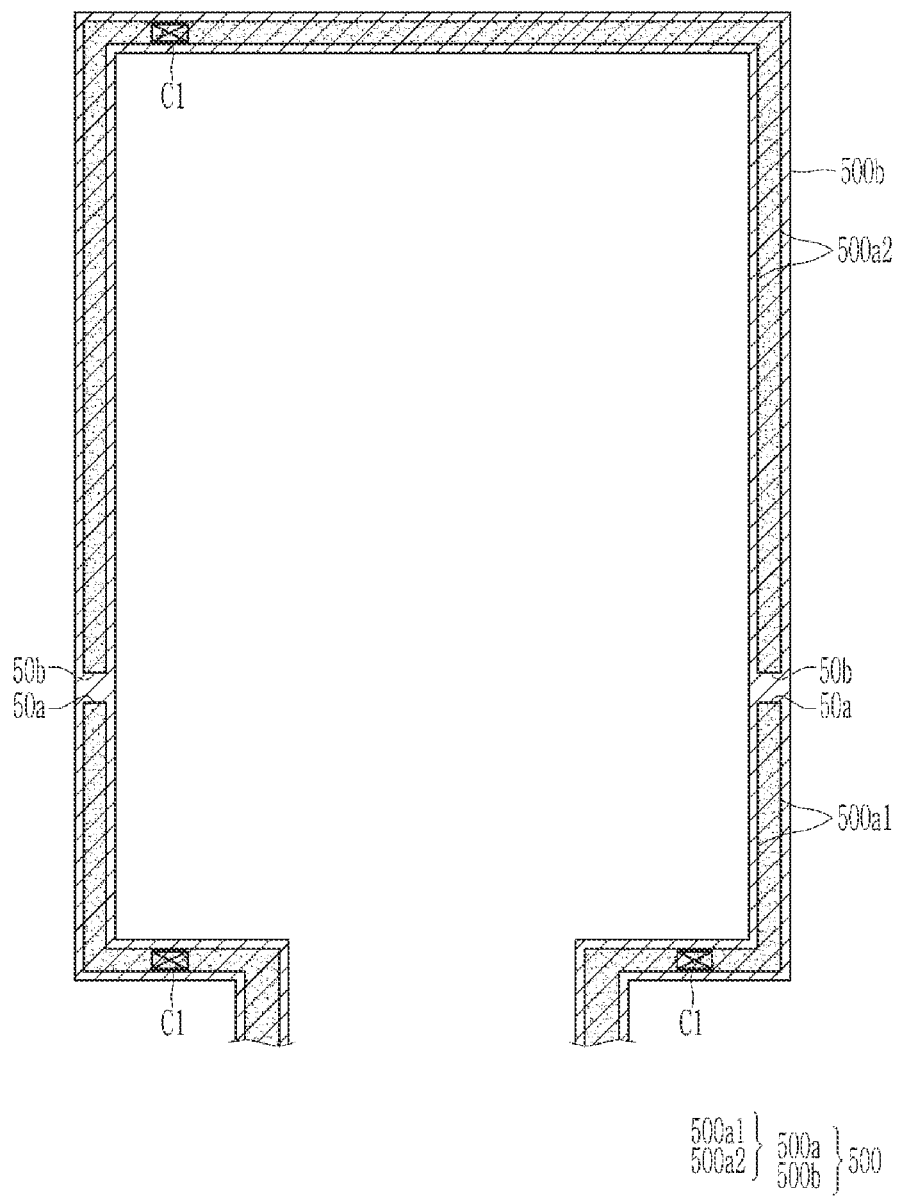
FIG. 2 shows a top plan view of part of a display device according to an embodiment.

A second voltage transmitting line 500 will now be described with reference to FIG. 2. FIG. 2 shows a top plan view of part of a display device according to an embodiment.

Referring to FIG. 1 and FIG. 2, the second voltage transmitting line 500 surrounds the display area DA in the non-display area NDA, and includes a first layer 500a and a second layer 500b overlapping each other.

The first layer 500a of the second voltage transmitting line 500 may include a first portion 500a1 and a second portion 500a2 separated from each other and disconnected from each other.

In detail, a first end portion 50a of the first portion 500a1 and a second end portion 50b of the second portion 500a2 are spaced from each other and may be disposed to face each other.

The first layer 500a of the second voltage transmitting line 500 may overlap the second layer 500b of the second voltage transmitting line 500, and they may be connected to each other through a first contact hole C1. In the embodiment of FIG. 2, there are multiple contact holes C1 providing connection between different sections of the first layer 500a and the second layer 500b.

A width of the first layer 500a of the second voltage transmitting line 500 may be less than a width of the second layer 500b of the second voltage transmitting line 500.

Figure 3:
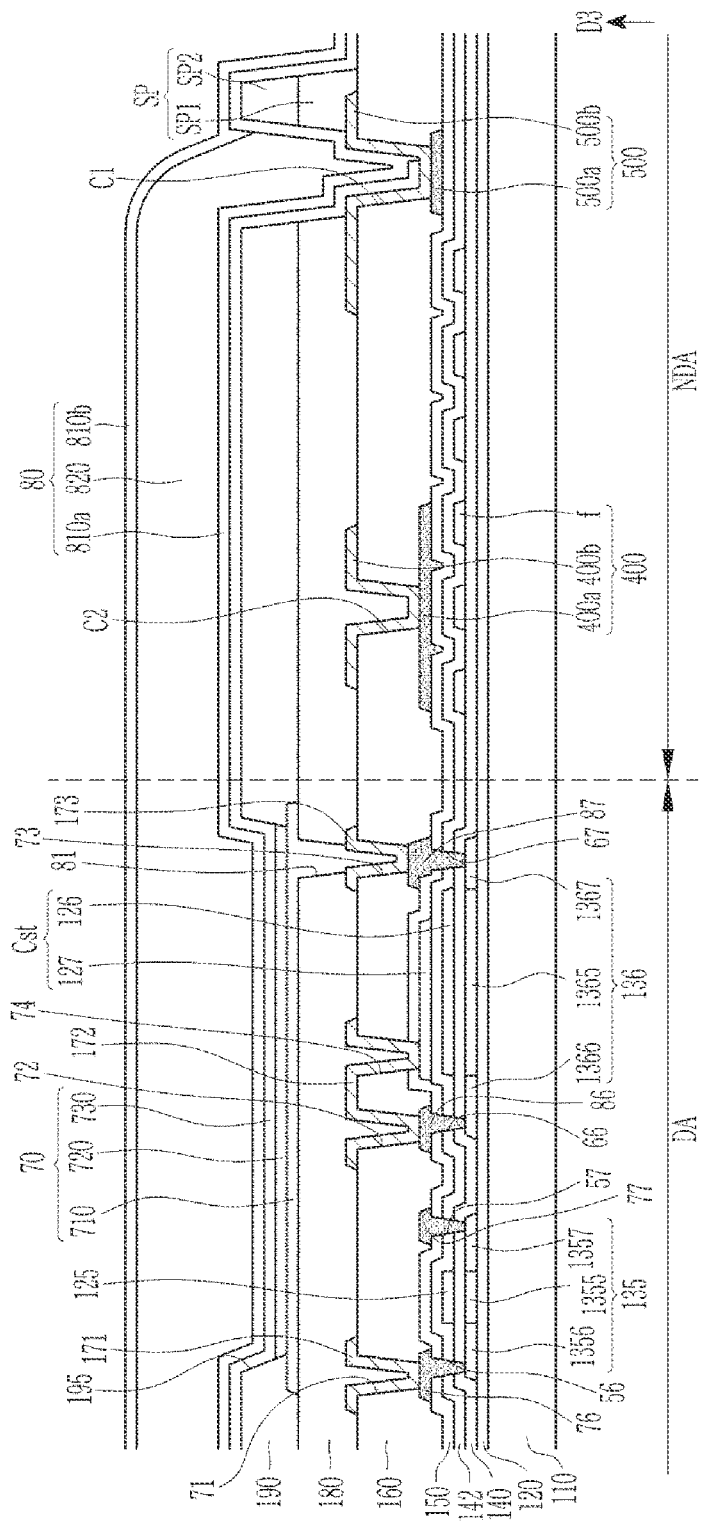
FIG. 3 shows a cross-sectional view of a predetermined region of FIG. 1.
Figure 4:
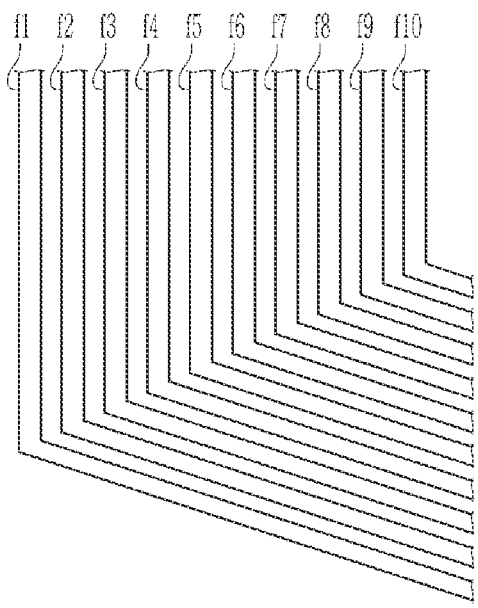
FIG. 4 to FIG. 6 sequentially show top plan views of disposal of signal lines of a predetermined region of FIG. 1.
Figure 5:
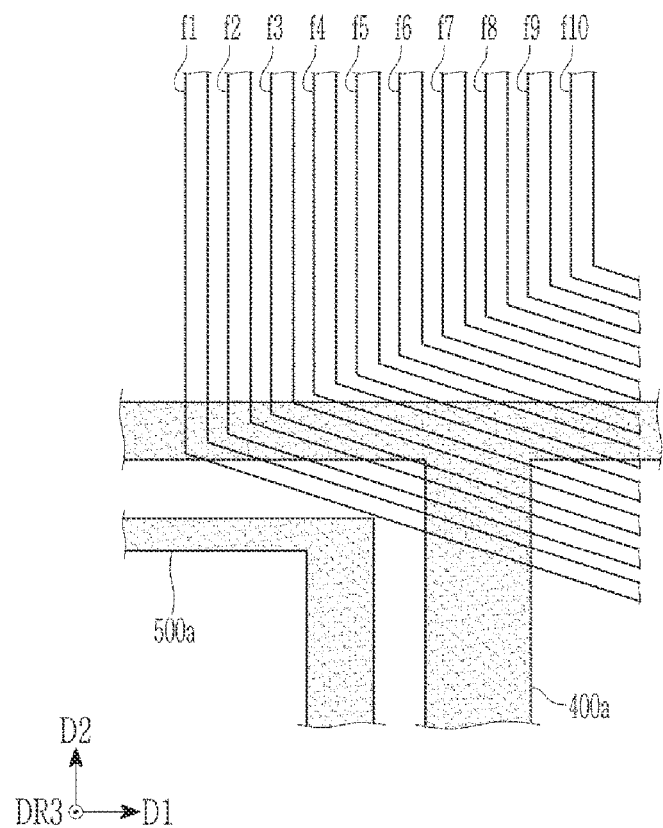
Figure 6:
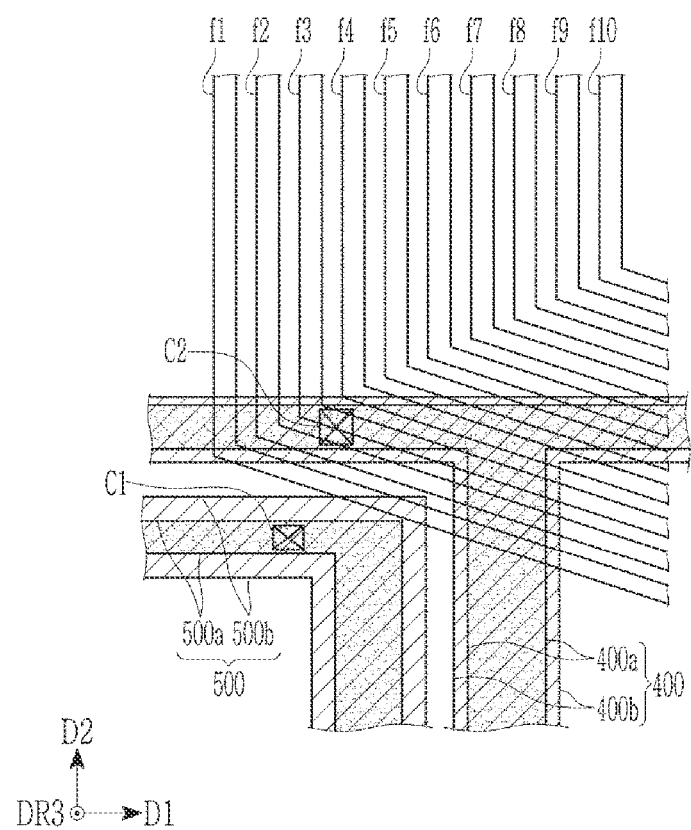

An inter-layer structure of the display area DA and the non-display area NDA of the display device according to an embodiment will now be described with reference to FIG. 1 to FIG. 6. FIG. 3 shows a cross-sectional view of a predetermined region of FIG. 1. FIG. 4 to FIG. 6 sequentially show top plan views of disposal of signal lines of a predetermined region of FIG. 1. FIG. 3 shows a cross-sectional view of an area (A) of FIG. 1.

As described above, the display device 1000 includes the display area DA and the non-display area NDA.

The display device 1000 includes a substrate 110, and the substrate 110 may be flexible. Although not shown, the substrate 110 may include a plurality of insulation films overlapping each other, and may further include a barrier film disposed between the insulation films.

A buffer layer 120 is provided on the substrate 110. The buffer layer 120 may include a single layer of an insulating layer such as a silicon nitride (SiNx) or a silicon oxide (SiOx), or a plurality of multilayers generated by stacking a silicon nitride (SiNx) and a silicon oxide (SiOx). The buffer layer 120 prevents permeation of unnecessary components such as impurities or moisture.

A first semiconductor layer 135 and a second semiconductor layer 136 are disposed on the buffer layer 120 of the display area DA.

The first semiconductor layer 135 and the second semiconductor layer 136 may include polysilicon or an oxide semiconductor. In this instance, the oxide semiconductor may include one of an oxide made of titanium (Ti), hafnium (Hf), zirconium (Zr), aluminum (Al), tantalum (Ta), germanium (Ge), zinc (Zn), gallium (Ga), tin (Sn), or indium (In), or a compound oxide thereof.

The first semiconductor layer 135 includes a first channel region 1355, and a first source region 1356 and a first drain region 1357 provided on different sides of the first channel region 1355. Similarly, the second semiconductor layer 136 includes a second channel region 1365, and a second source region 1366 and a second drain region 1367 disposed on different sides of the second channel region 1365. The first channel region 1355 of the first semiconductor layer 135 and the second channel region 1365 of the second semiconductor layer 136 may be regions in which no impurity is doped, and the first source region 1356 and the first drain region 1357 of the first semiconductor layer 135 and the second source region 1366 and the second drain region 1367 of the second semiconductor layer 136 may be regions in which conductive impurities may be doped.

A first gate insulating layer 140 is disposed on the first semiconductor layer 135 and the second semiconductor layer 136.

A first gate electrode 125 and a second gate electrode 126 are disposed on the first gate insulating layer 140 of the display area DA.

The first gate electrode 125 overlaps the first channel region 1355, and the second gate electrode 126 overlaps the second channel region 1365.

A plurality of connection lines f1, f2, f3, f4, f5, f6, f7, f8, f9, and f10 are disposed on the first gate insulating layer 140 of the non-display area NDA.

The connection lines f1, f2, f3, f4, f5, f6, f7, f8, f9, and f10 may extend in the second direction D2 and may be bent to be inclined in the first direction D1 and the second direction D2, and they are spaced from each other.

The connection lines f1, f2, f3, f4, f5, f6, f7, f8, f9, and f10, the first gate electrode 125, and the second gate electrode 126 may be formed on a same layer. The connection lines f1, f2, f3, f4, f5, f6, f7, f8, f9, and f10, the first gate electrode 125, and the second gate electrode 126 may be made of a first metal layer.

The first metal layer may include molybdenum (Mo), aluminum (Al), copper (Cu), silver (Ag), chromium (Cr), tantalum (Ta), and titanium (Ti), and it may be a single-layered or multi-layered structure including the same. In detail, the first metal layer may be a single layer made of molybdenum (Mo).

FIG. 4 shows a plurality of connection lines f1, f2, f3, f4, f5, f6, f7, f8, f9, and f10 that are a first metal layer of the non-display area NDA.

A second gate insulating layer 142 is disposed on the first gate electrode 125, the second gate electrode 126, and the connection lines f1, f2, f3, f4, f5, f6, f7, f8, f9, and f10.

The first gate insulating layer 140 and the second gate insulating layer 142 may be a single layer including a silicon oxide (SiOx) and a silicon nitride (SiNx), or a multilayer on which they are stacked.

A storage electrode 127 is disposed on the second gate insulating layer 142 of the display area DA.

A first interlayer insulating layer 150 may be disposed on the storage electrode 127. The first interlayer insulating layer 150 may be a single layer including a silicon oxide (SiOx) and a silicon nitride (SiNx), or a multilayer on which they are stacked.

A first contact hole 56 overlapping a first source region 1356 of the first semiconductor layer 135, a second contact hole 57 overlapping a first drain region 1357 of the first semiconductor layer 135, a third contact hole 66 overlapping a second source region 1366 of the second semiconductor layer 136, and a fourth contact hole 67 overlapping a second drain region 1367 of the second semiconductor layer 136 are formed in the first gate insulating layer 140, the second gate insulating layer 142, and the first interlayer insulating layer 150.

A first source electrode 76, a first drain electrode 77, a second source electrode 86, and a second drain electrode 87 are disposed on the first interlayer insulating layer 150 of the display area DA.

The first source electrode 76 is connected to the first source region 1356 of the first semiconductor layer 135 through the first contact hole 56, the first drain electrode 77 is connected to the first drain region 1357 of the first semiconductor layer 135 through the second contact hole 57, the second source electrode 86 is connected to the second source region 1366 of the second semiconductor layer 136 through the third contact hole 66, and the second drain electrode 87 is connected to the second drain region 1367 of the second semiconductor layer 136 through the fourth contact hole 67. Although not shown, the first drain electrode 77 is connected to the second gate electrode 126.

A first layer 400a of the first voltage transmitting line 400 and a first layer 500a of the second voltage transmitting line 500 are disposed on the first interlayer insulating layer 150 of the non-display area NDA.

The first layer 400a of the first voltage transmitting line 400 includes a portion extending in the first direction D1 and a portion expanding therefrom and extending toward the driving area PA, and the first layer 400a of the first voltage transmitting line 400 overlaps some connection lines f from among the connection lines f1, f2, f3, f4, f5, f6, f7, f8, f9, and f10 in a third direction D3 that is perpendicular to the surface of the substrate 110. The third direction D3 is also referred to herein as the "depth direction."

The first layer 500a of the second voltage transmitting line 500 does not overlap the connection lines f1, f2, f3, f4, f5, f6, f7, f8, f9, and f10 in the third direction D3 that is perpendicular to the surface of the substrate 110.

The first source electrode 76, the first drain electrode 77, the second source electrode 86, and the second drain electrode 87 of the display area DA may be formed on the same layer as the first layer 400a of the first voltage transmitting line 400 and the first layer 500a of the second voltage transmitting line 500 of the non-display area NDA. The first source electrode 76, the first drain electrode 77, the second source electrode 86, the second drain electrode 87, the first layer 400a of the first voltage transmitting line 400, and the first layer 500a of the second voltage transmitting line 500 may be made of a second metal layer.

The second metal layer may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and may be a single-layered or multi-layered structure including the same. For example, the second metal layer may have a triple-layer structure including a lower layer made of titanium (Ti), an intermediate layer made of aluminum (Al), and an upper layer made of titanium (Ti).

FIG. 5 shows a plurality of connection lines f1, f2, f3, f4, f5, f6, f7, f8, f9, and f10 configuring the first metal layer of the non-display area NDA and the first layer 400a of the first voltage transmitting line 400 and the first layer 500a of the second voltage transmitting line 500 configuring the second metal layer.

As described above, the first layer 400a of the first voltage transmitting line 400 overlaps some connection lines f from among the connection lines f1, f2, f3, f4, f5, f6, f7, f8, f9, and f10 in the third direction D3 that is perpendicular to the surface of the substrate 110, and the first layer 500a of the second voltage transmitting line 500 does not overlap the connection lines f1, f2, f3, f4, f5, f6, f7, f8, f9, and f10 in the third direction D3 that is perpendicular to the surface of the substrate 110.

As shown in FIG. 2, the first layer 500a of the second voltage transmitting line 500 may be divided into a first portion 500a1 and a second portion 500a2 that are spaced from each other and are not connected to each other.

A second interlayer insulating layer 160 is disposed on the first source electrode 76, the first drain electrode 77, the second source electrode 86, the second drain electrode 87, the first layer 400a of the first voltage transmitting line 400, and the first layer 500a of the second voltage transmitting line 500. The second interlayer insulating layer 160 may include an organic material, and may be a planarized layer of which a surface is substantially flat.

A fifth contact hole 71 overlapping the first source electrode 76, a sixth contact hole 72 overlapping the second source electrode 86, and a seventh contact hole 73 overlapping the second drain electrode 87 are formed in the second interlayer insulating layer 160 of the display area DA. An eighth contact hole 74 overlapping the storage electrode 127 is formed in the first interlayer insulating layer 150 and the second interlayer insulating layer 160. An eighth contact hole C1 overlapping the first layer 500a of the second voltage transmitting line 500 and a ninth contact hole C2 overlapping the first layer 400a of the first voltage transmitting line 400 are formed in the second interlayer insulating layer 160 of the non-display area NDA.

A data line 171, a driving signal line 172, and an output member 173 are disposed on the second interlayer insulating layer 160 of the display area DA.

The data line 171 of the display area DA is connected to the first source electrode 76 through the fifth contact hole 71, and the driving signal line 172 is connected to the second source electrode 86 through the sixth contact hole 72 and is connected to the storage electrode 127 through the eighth contact hole 74. The output member 173 is connected to the second drain electrode 87 through the seventh contact hole 73.

A second layer 400b of the first voltage transmitting line 400 and a second layer 500b of the second voltage transmitting line 500 are disposed on the second interlayer insulating layer 160 of the non-display area NDA.

The second layer 400b of the first voltage transmitting line 400 overlaps the first layer 400a of the first voltage transmitting line 400 in the third direction D3, and the second layer 500b of the second voltage transmitting line 500 overlaps the first layer 500a of the second voltage transmitting line 500 in the third direction D3.

The second layer 400b of the first voltage transmitting line 400 is connected to the first layer 400a of the first voltage transmitting line 400 through the ninth contact hole C2, and the second layer 500b of the second voltage transmitting line 500 is connected to the first layer 500a of the second voltage transmitting line 500 through the eighth contact hole C1.

A width of the second layer 500b of the second voltage transmitting line 500 may be greater than a width of the first layer 500a of the second voltage transmitting line 500.

The second layer 400b of the first voltage transmitting line 400 and the second layer 500b of the second voltage transmitting line 500 of the non-display area NDA may be simultaneously formed on the same layer as the data line 171, the driving signal line 172, and the output member 173 of the display area DA.

The data line 171, the driving signal line 172, the output member 173, the second layer 400b of the first voltage transmitting line 400, and the second layer 500b of the second voltage transmitting line 500 may be made of a third metal layer. The third metal layer may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and may be a single-layered or multi-layered structure. For example, the third metal layer may have a triple-layer structure including a lower layer made of titanium (Ti), an intermediate layer made of aluminum (Al), and an upper layer made of titanium (Ti).

FIG. 6 shows a plurality of connection lines f1, f2, f3, f4, f5, f6, f7, f8, f9, and f10 configuring the first metal layer of the non-display area NDA, the first layer 400a of the first voltage transmitting line 400 and the first layer 500a of the second voltage transmitting line 500 configuring the second metal layer, and the second layer 400b of the first voltage transmitting line 400 and the second layer 500b of the second voltage transmitting line 500 configuring the third metal layer.

The second layer 400b of the first voltage transmitting line 400 and the second layer 500b of the second voltage transmitting line 500 overlap some connection lines f from among a plurality of connection lines f1, f2, f3, f4, f5, f6, f7, f8, f9, and f10 in the third direction D3 that is perpendicular to the surface of the substrate 110.

A third interlayer insulating layer 180 is disposed on the data line 171, the driving signal line 172, and the output member 173 of the display area DA, and a first spacer portion SP1 forming a spacer SP is disposed in the non-display area NDA.

The third interlayer insulating layer 180 and the first spacer portion SP1 may include an organic material and may be simultaneously formed on the same layer. The third interlayer insulating layer 180 may be a planarized layer of which the surface is substantially flat.

A pixel electrode 710 is disposed on the third interlayer insulating layer 180 disposed in the display area DA. The pixel electrode 710 is connected to the output member 173 through the ninth contact hole 81 formed in the third interlayer insulating layer 180.

The pixel electrode 710 may be an anode of the organic light emitting element.

A pixel defining layer 190 is disposed on the pixel electrode 710 of the display area DA. The pixel defining layer 190 includes a pixel opening 195 overlapping the pixel electrode 710. The pixel opening 195 of the pixel defining layer 190 is disposed in the display area DA, and the pixel defining layer 190 is mainly disposed in the display area.

A second spacer portion SP2 forming a spacer SP is disposed in the non-display area NDA.

The pixel defining layer 190 and the second spacer portion SP2 may be simultaneously formed on the same layer.

The pixel defining layer 190 may include a polyacrylate or polyimide resin and a silica-based inorganic matter, and it may reduce reflectance of external light and may increase a contrast ratio of the display device by including a black color pigment or/and dye and absorbing the external light.

An organic emission layer 720 is disposed in the pixel opening 195 of the pixel defining layer 190 disposed in the display area DA.

The organic emission layer 720 may be a multilayer including an emission layer and at least one of a hole injection layer (HIL), a hole-transporting layer (HTL), an electron-transporting layer (ETL), and an electron injection layer (EIL). When the organic emission layer 720 includes all of them, the hole injection layer may be disposed on the pixel electrode 710 that is an anode, and the hole transporting layer, the emission layer, the electron transporting layer, and the electron injection layer may be sequentially stacked thereon A common electrode 730 is disposed on the pixel defining layer 190 and the organic emission layer 720. The common electrode 730 becomes a cathode of the organic light emitting element. Therefore, the pixel electrode 710, the organic emission layer 720, and the common electrode 730 configure an organic light emitting element 70.

The common electrode 730 is disposed on a front side of the display area DA, and it may expand to the non-display area NDA to contact the second layer 500b of the second voltage transmitting line 500 disposed in the non-display area NDA, and may receive a common voltage from the second driving voltage transmitting line 500.

The first semiconductor layer 135, the first gate electrode 125, the first source electrode 76, and the first drain electrode 77 configure a first transistor, and the second semiconductor layer 136, the second gate electrode 126, the second source electrode 86, and the second drain electrode 87 configure a second transistor. The first transistor may be a switching transistor, and the second transistor may be a driving transistor.

When a gate On signal is applied to the first gate electrode 125 and a data signal is applied to the first source electrode 76 from the data line 171, the data signal is transmitted to the first drain electrode 77 and is then transmitted to the second gate electrode 126. Further, a driving voltage applied to the driving signal line 172 is applied to the second source electrode 86, and a corresponding driving current is applied to the second drain electrode 87 through the second channel region 1365 of the second semiconductor layer 136. A voltage applied to the second drain electrode 87 is transmitted to the pixel electrode 710 through an output member 173, and a common voltage is applied to the common electrode 730 through the voltage transmitting line 500. The pixel electrode 710 is an anode that is a hole injecting electrode, and the common electrode 730 becomes a cathode that is an electron injecting electrode. Holes and electrons are injected into the organic emission layer 720 from the pixel electrode 710 and the common electrode 730, and when excitons that are a combination of holes and electrons are changed to the ground state from the excited state, light emits.

A capacitor Cst is connected between the second gate electrode 126 and the storage electrode 127. The capacitor Cst charges the data signal applied to the second gate electrode 126 and maintains the same.

An encapsulation layer 80 is disposed on the common electrode 730 and the spacer SP. The encapsulation layer 80 may be formed by alternately stacking at least one inorganic layer and at least one organic layer, and the inorganic layer or the organic layer may be plural.

In the shown embodiment, the encapsulation layer 80 includes a first inorganic encapsulation layer 810a and a second inorganic encapsulation layer 810b, and includes an organic encapsulation layer 820 disposed between the first inorganic encapsulation layer 810a and the second inorganic encapsulation layer 810b.

The first inorganic encapsulation layer 810a and the second inorganic encapsulation layer 810b are formed on the front side of the substrate 110 and are also disposed on the spacer SP, and the organic encapsulation layer 820 is not disposed outside the spacer SP in the non-display area NDA.

When the organic encapsulation layer 820 is formed, the spacer SP may function as a dam for preventing overflow of an organic material for forming the organic encapsulation layer 820, and the organic material is formed to not overflow to the outside of the spacer SP, so the organic encapsulation layer 820 may be formed to not be disposed outside the spacer SP.

A structure of a pixel disposed in the display area DA of the display device shown in FIG. 3 is an example, and adjustments to the structure shown in FIG. 2 may be made without departing from the scope of this disclosure. The signal line and the organic light emitting element may have various types of structures within the range in which a person skilled in the art may easily modify the same. For example, FIG. 3 shows a display device including two thin film transistors (TFT) and one capacitor, but the embodiment is not limited thereto. The display device is not limited in the number of thin film transistors, capacitors, and wires.

As described above, the first voltage transmitting line 400 and the second voltage transmitting line 500 disposed in the non-display area NDA include first layers 400a and 500a and second layers 400b and 500b overlapping each other with the second interlayer insulating layer 160 therebetween in the third direction D3 that is perpendicular to the surface of the substrate 110.

As described, as the first voltage transmitting line 400 and the second voltage transmitting line 500 are formed to include the first layers 400a and 500a and the second layers 400b and 500b overlapping each other in the third direction D3, so the widths of the first voltage transmitting line 400 and the second voltage transmitting line 500 may be reduced and signal resistance may also be reduced.

As the signal resistance of the first voltage transmitting line 400 and the second voltage transmitting line 500 is reduced and the lines have narrow widths, an area of the non-display area NDA in which the first voltage transmitting line 400 and the second voltage transmitting line 500 are disposed may be reduced.

Figure 7:
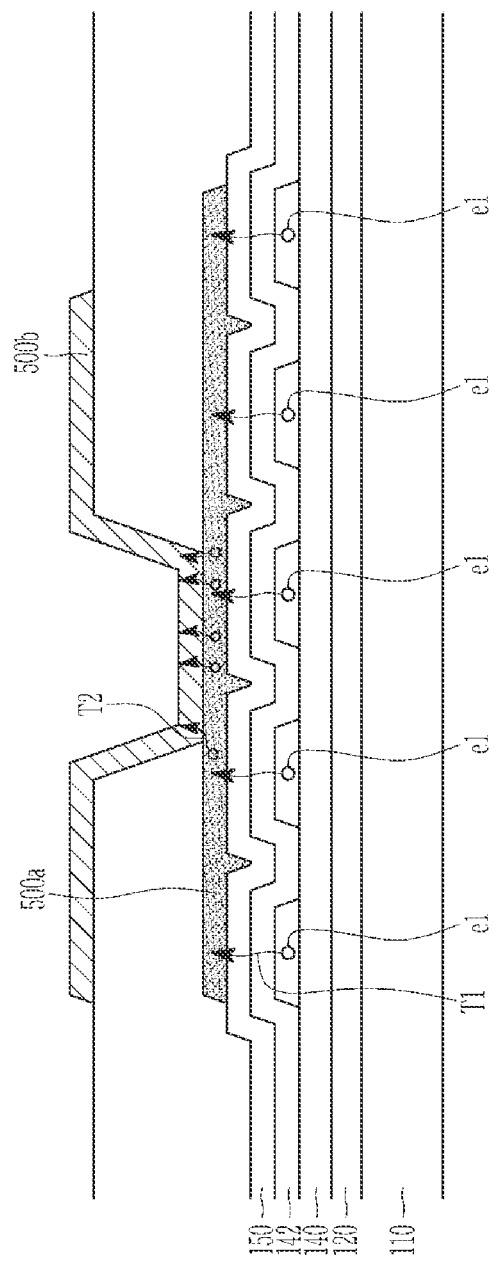
FIG. 7 and FIG. 8 show cross-sectional views of part of a display device according to an embodiment.
Figure 8:
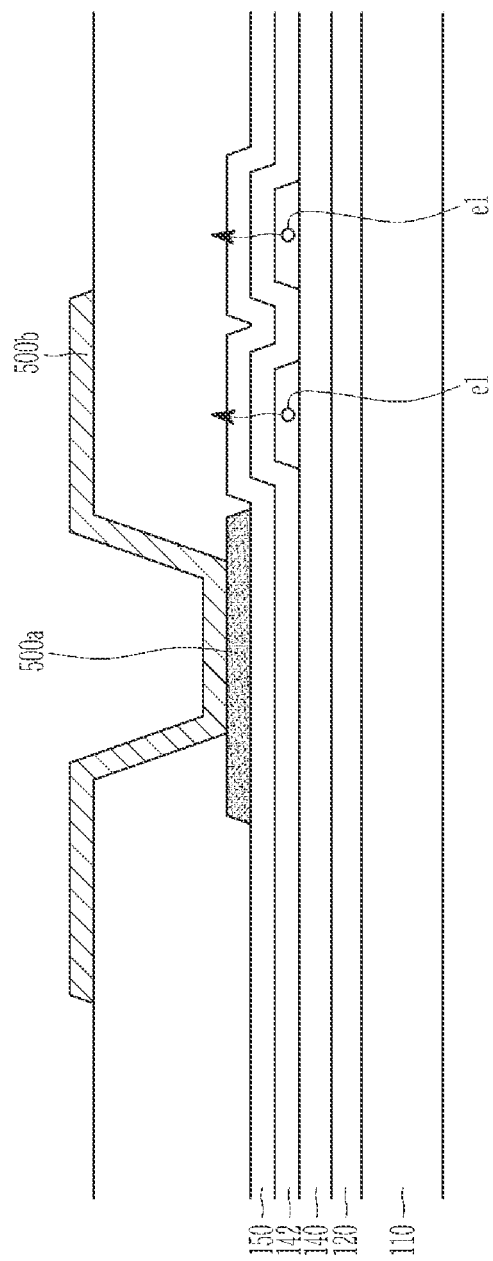

The second voltage transmitting line 500 of the display device 1000 according to an embodiment will now be described in detail with reference to FIG. 7 and FIG. 8 together with FIG. 1 to FIG. 6. FIG. 7 and FIG. 8 show cross-sectional views of part of a display device according to an embodiment.

Referring to FIG. 7, static electricity charges el generated during the process for manufacturing a display device 1000 may make a first move T1 along the connection lines f1, f2, f3, f4, f5, f6, f7, f8, f9, and f10 to move to the first layer 500a of the second voltage transmitting line 500, and the static electricity charges el may make a second move T2 to the second layer 500b of the second voltage transmitting line 500, and the second voltage transmitting line 500 may be accordingly damaged.

The first voltage transmitting line 400 of the display device 1000 extends in the first direction D1, so static electricity may be removed through respective end portions thereof, but the second voltage transmitting line 500 surrounds the display area DA along the non-display area NDA, so it is difficult to remove static electricity.

As described above, the first layer 400a of the first voltage transmitting line 400 overlaps some connection lines f of the connection lines f1, f2, f3, f4, f5, f6, f7, f8, f9, and f10 in the third direction D3 that is perpendicular to the surface of the substrate 110, and the first layer 500a of the second voltage transmitting line 500 does not overlap the connection lines f1, f2, f3, f4, f5, f6, f7, f8, f9, and f10 in the third direction D3. Further, the first layer 500a of the second voltage transmitting line 500 may be divided into a first portion 500a1 and a second portion 500a2 that are spaced from each other and are not connected to each other, and the first end portion 50a of the first portion 500a1 and the second end portion 50b of the second portion 500a2 may be spaced from each other and may face each other.

As described above, the first layer 500a of the second voltage transmitting line 500 disposed relatively near the connection lines f1, f2, f3, f4, f5, f6, f7, f8, f9, and f10 in the third direction D3 does not overlap the connection lines f1, f2, f3, f4, f5, f6, f7, f8, f9, and f10, so as shown in FIG. 8, it is difficult for the static electricity charges el that are movable along the connection lines f1, f2, f3, f4, f5, f6, f7, f8, f9, and f10 to move to the first layer 500a of the second voltage transmitting line 500. Further, the first layer 500a of the second voltage transmitting line 500 is formed to be divided into a first portion 500a1 and a second portion 500a2 that are spaced from each other and are not connected to each other, so the static electricity charges el that are movable to the first layer 500a of the second voltage transmitting line 500 may be removed by the first end portion 50a of the first portion 500a1 and the second end portion 50b of the second portion 500a2, and may not be moved to the second layer 500b of the second voltage transmitting line 500.

The width of the second layer 500b of the second voltage transmitting line 500 is formed to be greater than the width of the first layer 500a of the second voltage transmitting line 500 so as to overlap some connection lines f from among the connection lines f1, f2, f3, f4, f5, f6, f7, f8, f9, and f10 in the third direction D3 that is perpendicular to the surface of the substrate 110, thereby reducing signal resistance of the second voltage transmitting line 500, preventing the static electricity charges el that are movable along the connection lines f1, f2, f3, f4, f5, f6, f7, f8, f9, and f10 from moving along the second voltage transmitting line 500, and resultantly preventing the second voltage transmitting line 500 from being damaged by static electricity.

Figure 9:
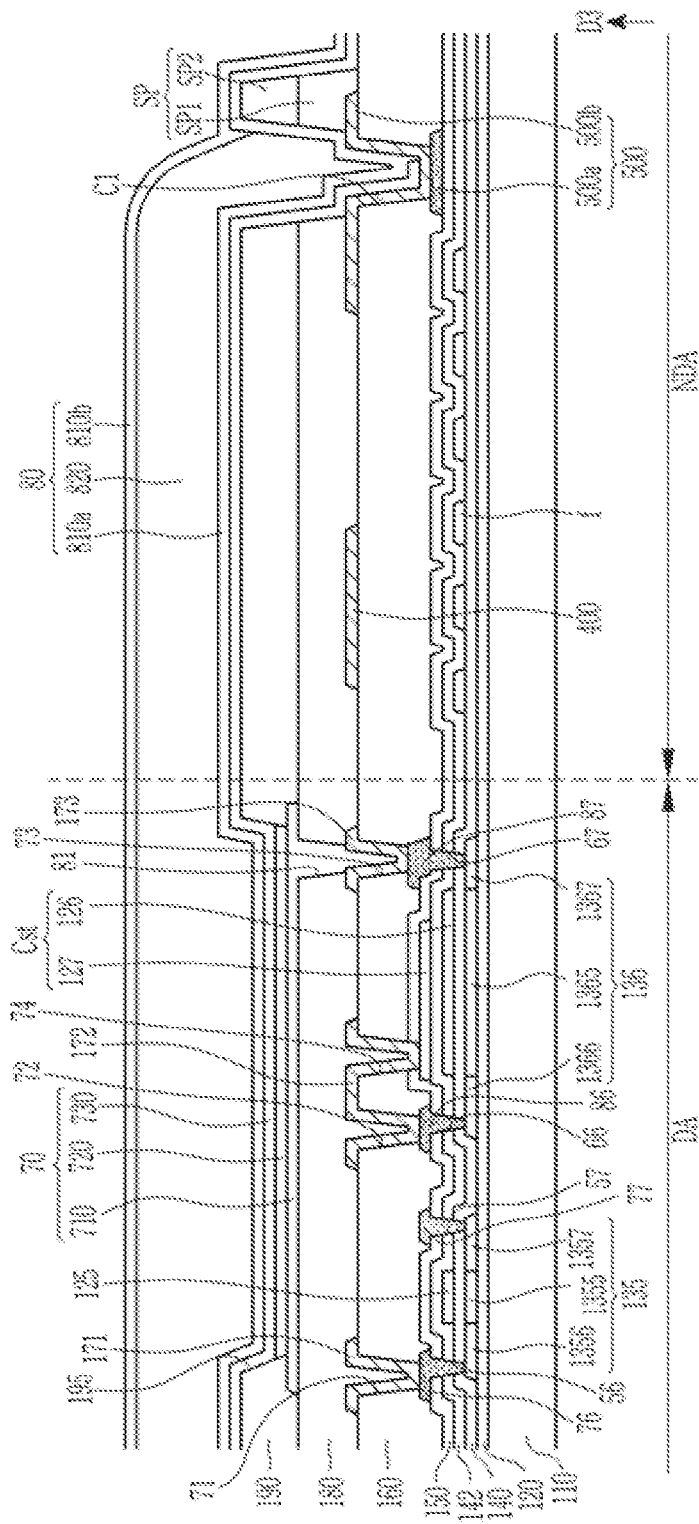
FIG. 9 shows a cross-sectional view of part of a display device according to another embodiment.

A display device according to another embodiment will now be described with reference to FIG. 9. FIG. 9 shows a cross-sectional view of part of a display device according to another embodiment.

Referring to FIG. 9, the display device according to the present embodiment is similar to the above-described display device according to an embodiment. No detailed descriptions of the same constituent elements will be provided.

Differing from the above-described display device according to an embodiment, the first driving signal transmitting line 400 of the display device according to the present embodiment may be configured with a single layer, and the first driving signal transmitting line 400 may be made of a third metal layer in a like way of the data line 171 and the driving signal line 172 of the display area DA and the second layer 500b of the second voltage transmitting line 500 of the non-display area NDA.

Further, the first voltage transmitting line 400 may overlap some connection lines f from among the connection lines f1, f2, f3, f4, f5, f6, f7, f8, f9, and f10 in the third direction D3 that is perpendicular to the surface of the substrate 110. The first layer 500a of the second voltage transmitting line 500 does not overlap the connection lines f1, f2, f3, f4, f5, f6, f7, f8, f9, and f10 in the third direction D3, and the second layer 500b of the second voltage transmitting line 500 may overlap some connection lines f of the connection lines f1, f2, f3, f4, f5, f6, f7, f8, f9, and f10 in the third direction D3.

Many characteristics of the display device according to embodiments described with reference to FIG. 1 to FIG. 8 are applicable to the display device according to the present embodiment.

Figure 10:
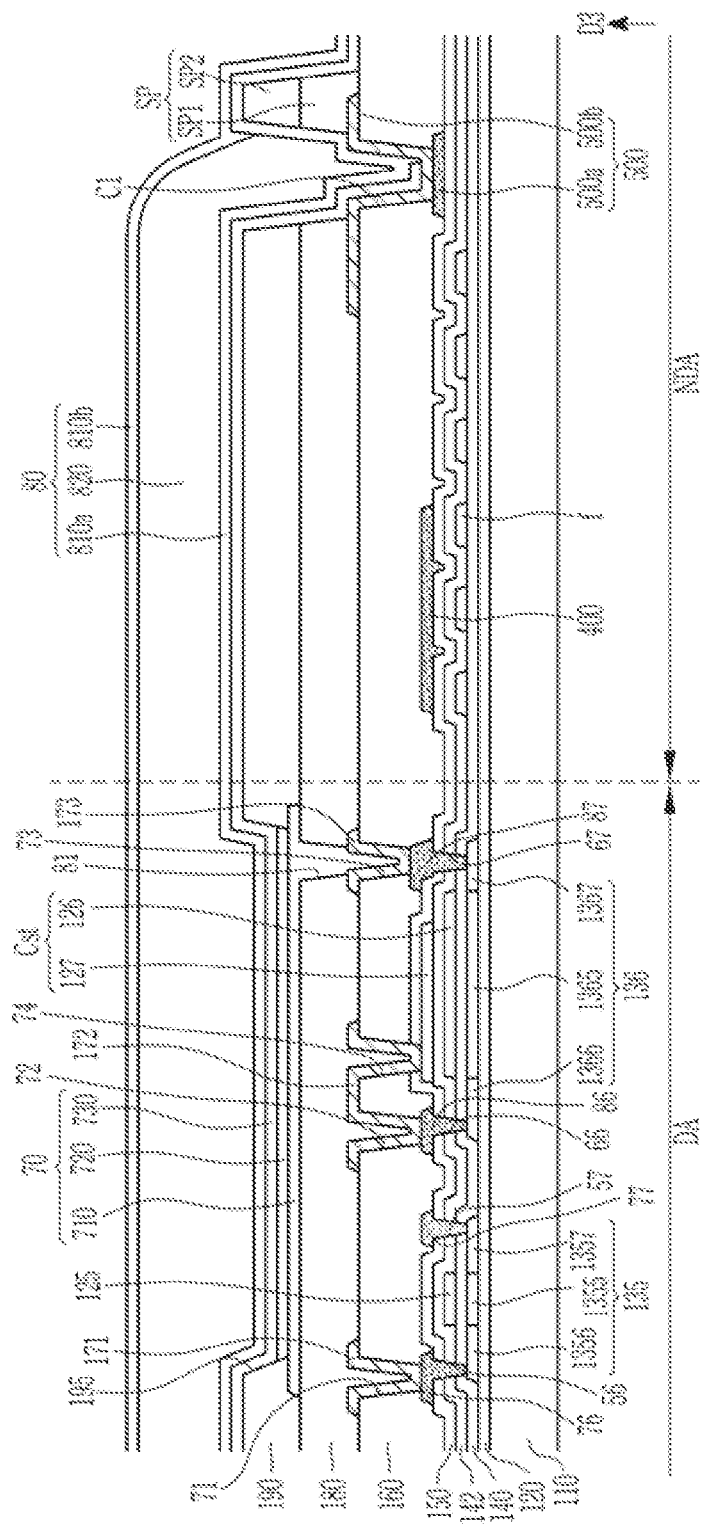
FIG. 10 shows a cross-sectional view of part of a display device according to another embodiment.

A display device according to another embodiment will now be described with reference to FIG. 10. FIG. 10 shows a cross-sectional view of part of a display device according to another embodiment.

Referring to FIG. 10, the display device according to the present embodiment is similar to the above-described display device according to an embodiment. No detailed descriptions of the same constituent elements will be provided.

Differing from the above-described display device according to an embodiment, the first driving signal transmitting line 400 of the display device according to the present embodiment may be made of a single layer, and the first driving signal transmitting line 400 may be made of a second metal layer in a like way of the first source electrode 76, the first drain electrode 77, the second source electrode 86, and the second drain electrode 87 of the display area DA and the first layer 400a of the first voltage transmitting line 400 of the non-display area NDA.

Further, the first voltage transmitting line 400 may overlap some connection lines f from among the connection lines f1, f2, f3, f4, f5, f6, f7, f8, f9, and f10 in the third direction D3, the first layer 500a of the second voltage transmitting line 500 may not overlap the connection lines f1, f2, f3, f4, f5, f6, f7, f8, f9, and f10 in the third direction D3, and the second layer 500b of the second voltage transmitting line 500 may overlap some connection lines f from among the connection lines f1, f2, f3, f4, f5, f6, f7, f8, f9, and f10 in the third direction D3 that is perpendicular to the surface of the substrate 110.

Many characteristics of the display device according to embodiments described with reference to FIG. 1 to FIG. 8 are applicable to the display device according to the present embodiment.

Figure 11:
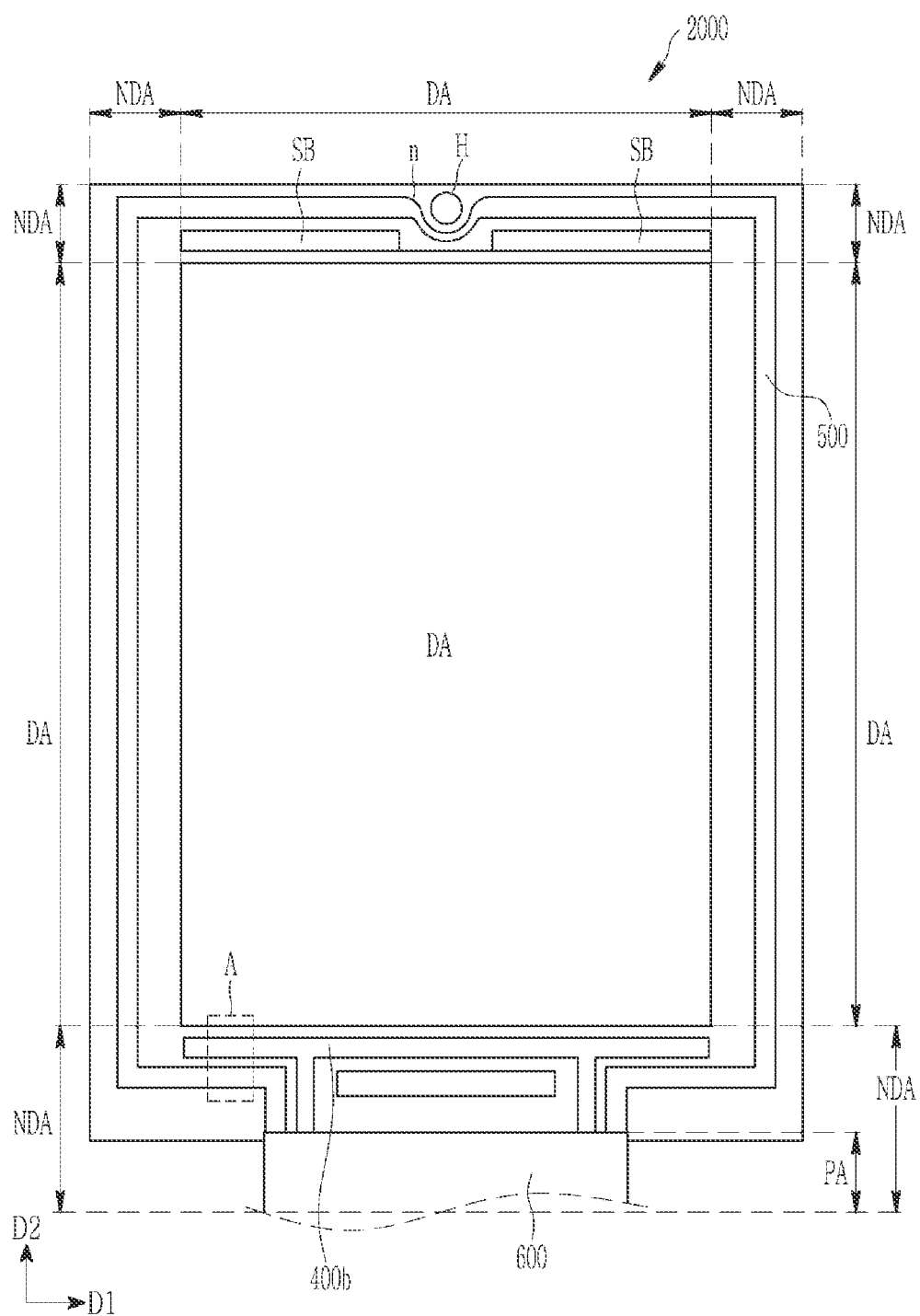
FIG. 11 shows a top plan view of a display device according to another embodiment.

A display device according to another embodiment will now be described with reference to FIG. 11 to FIG. 13. FIG. 11 shows a top plan view of a display device according to another embodiment, FIG. 12 shows a layout view of part of a display device according to another embodiment, and FIG. 13 shows a cross-sectional view of an area (A) of FIG. 11.

Figure 12:
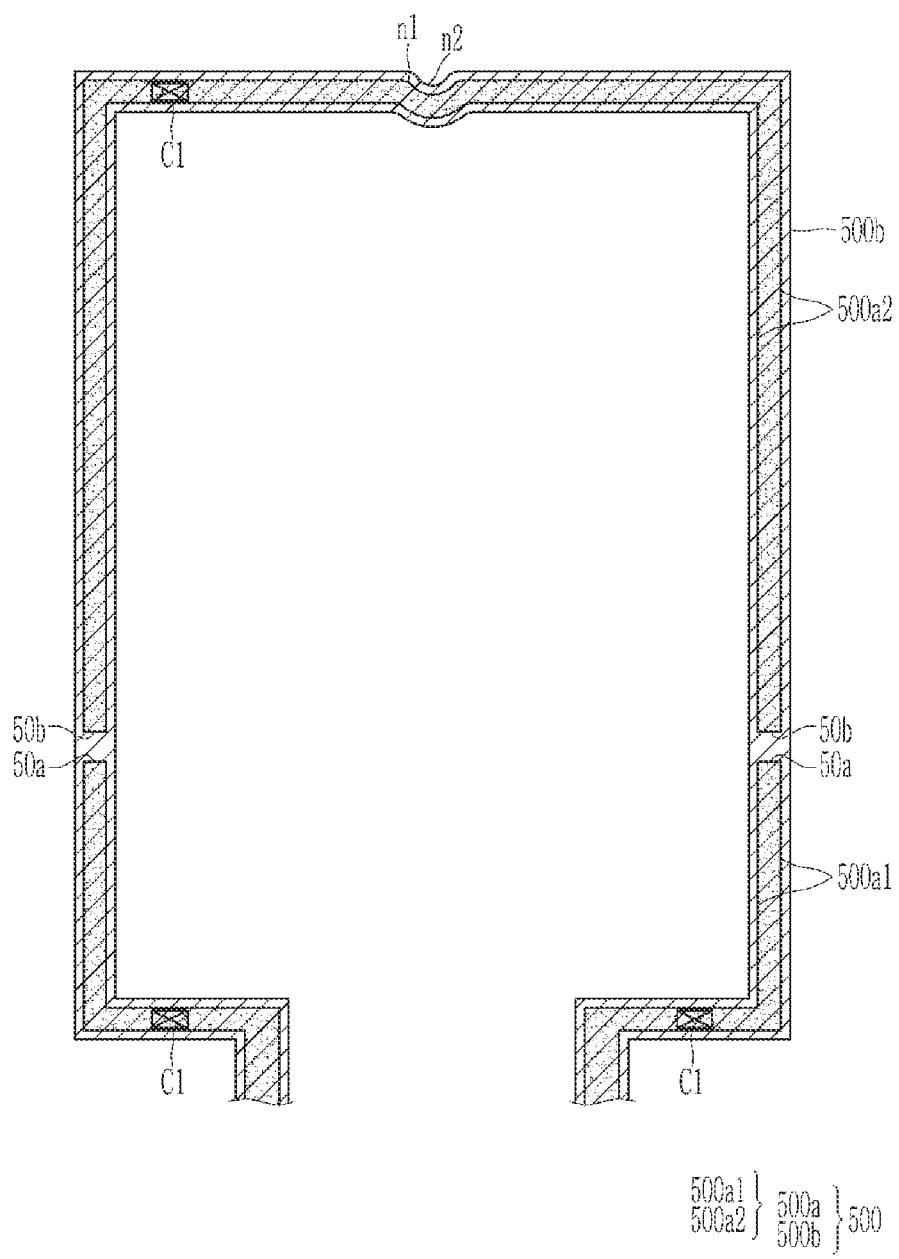
FIG. 12 shows a top plan view of part of a display device according to another embodiment.
Figure 13:
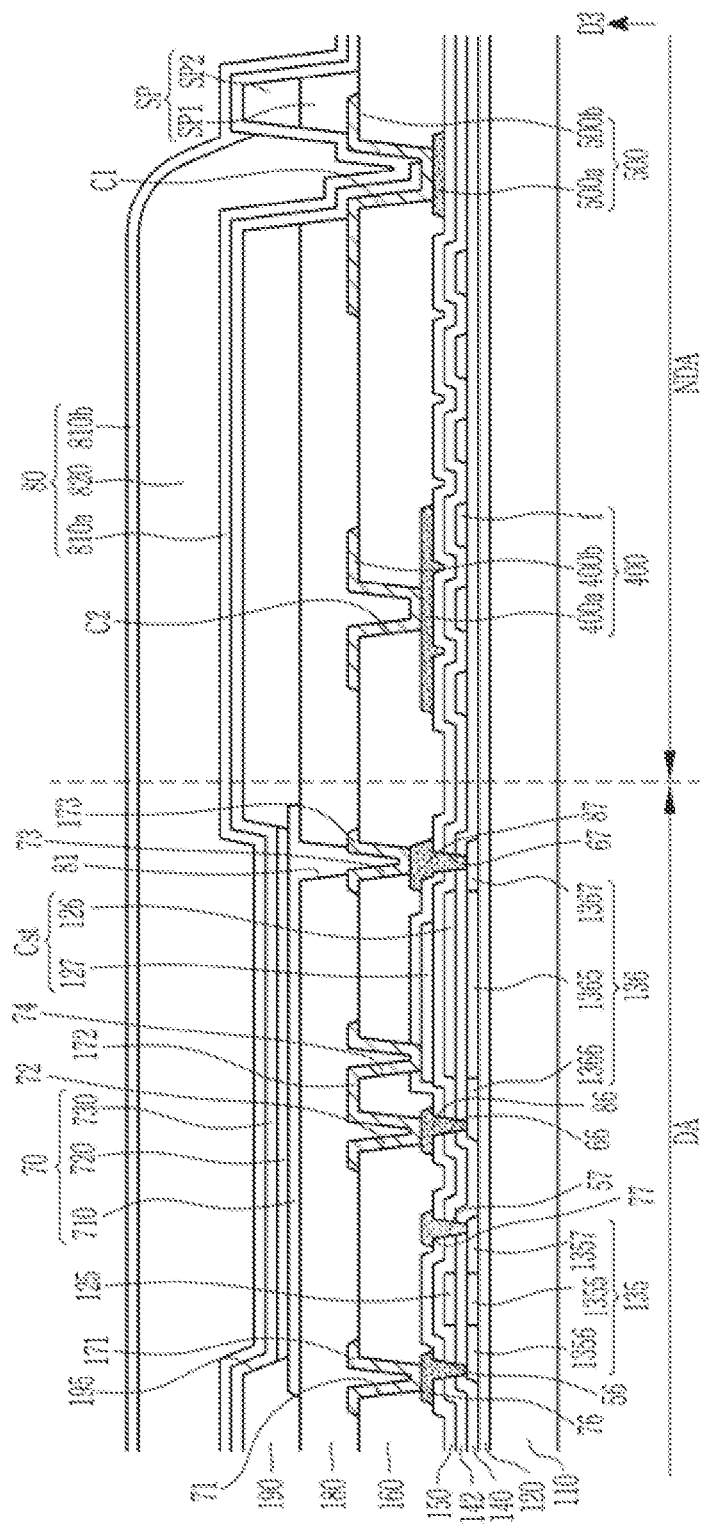
FIG. 13 shows a cross-sectional view of an area (A) of FIG. 11.

Referring to FIG. 11 to FIG. 13, the display device according to the present embodiment is similar to the above-described display device according to an embodiment given with reference to FIG. 1 to FIG. 6. No detailed descriptions of the same constituent elements will be provided.

Referring to FIG. 11 to FIG. 13, the display device 2000 according to the present embodiment includes a display area DA including a plurality of pixels and displaying images and a non-display area NDA disposed outside the display area DA.

A first voltage transmitting line 400 and a second voltage transmitting line 500 for transmitting driving voltages are disposed in the non-display area NDA. Pad electrodes electrically connected to an external device and a plurality of connection lines connected thereto may be disposed in the non-display area NDA. The connection lines may receive a data signal, a scan signal, an emission signal, a power voltage, and a touch sensing signal from the driving area PA and may transmit them to the display area DA.

The second voltage transmitting line 500 surrounds the display area DA along the non-display area NDA, and includes a first layer 500a and a second layer 500b overlapping each other.

The first layer 500a of the second voltage transmitting line 500 may be divided into a first portion 500a1 and a second portion 500a2 that are spaced from each other and are not connected to each other.

In detail, the first end portion 50a of the first portion 500a1 and the second end portion 50b of the second portion 500a2 may be spaced from each other and may face each other.

The first layer 500a of the second voltage transmitting line 500 may overlap the second layer 500b of the second voltage transmitting line 500, and they may be connected to each other through a first contact hole C1.

A width of the first layer 500a of the second voltage transmitting line 500 may be less than a width of the second layer 500b of the second voltage transmitting line 500.

However, differing from the display device 1000 according to an embodiment described with reference to FIG. 1 to FIG. 6, a hole H overlapping an optical device may be formed in the non-display area NDA of the display device 2000 according to the present embodiment, bent portions n, n1, and n2 of the second voltage transmitting line 500 disposed in the non-display area NDA may be included near the hole H, and widths may be reduced at the bent portions n, n1, and n2, and hence, when the static electricity charges are transmitted to the narrow portion of the second voltage transmitting line 500 disposed near the hole H, the second voltage transmitting line 500 may be easily damaged by the static electricity charges.

Further, a shorting bar SB may be disposed in the non-display area NDA of the display device 2000, and the shorting bar SB may be incised around the hole H, so the connection lines disposed near the bent portions n, n1, and n2 of the second voltage transmitting line 500 may not be connected to the shorting bar SB, and static electricity may move through a portion that is not connected to the shorting bar SB.

However, regarding the display device 2000 according to the present embodiment, in a like way to the display device 1000 described with reference to FIG. 1 to FIG. 6, the first voltage transmitting line 400 and the second voltage transmitting line 500 disposed in the non-display area NDA include first layers 400a and 500a and second layers 400b and 500b overlapping each other with a second interlayer insulating layer 160 therebetween in the third direction D3, the first voltage transmitting line 400 overlaps some connection lines f from among the connection lines f1, f2, f3, f4, f5, f6, f7, f8, f9, and f10 in the third direction D3 that is perpendicular to the surface of the substrate 110, the first layer 500a of the second voltage transmitting line 500 does not overlap the connection lines f1, f2, f3, f4, f5, f6, f7, f8, f9, and f10 in the third direction D3, and the second layer 500b of the second voltage transmitting line 500 may overlap some connection lines f from among the connection lines f1, f2, f3, f4, f5, f6, f7, f8, f9, and f10 in the third direction D3.

Further, the width of the second layer 500b of the second voltage transmitting line 500 is formed to be greater than the width of the first layer 500a of the second voltage transmitting line 500 so that the first layer 500a of the second voltage transmitting line 500 may be divided into a first portion 500a1 and a second portion 500a2 that are spaced from each other and are not connected to each other, and the second layer 500b of the second voltage transmitting line 500 may overlap some connection lines f from among the connection lines f1, f2, f3, f4, f5, f6, f7, f8, f9, and f10 in the third direction D3.

As described, the widths of the first voltage transmitting line 400 and the second voltage transmitting line 500 may be reduced and the signal resistance may be reduced by forming the first voltage transmitting line 400 and the second voltage transmitting line 500 so that they may include the first layers 400a and 500a and the second layers 400b and 500b overlapping each other in the third direction D3.

Further, the static electricity charges that are movable along the connection lines f1, f2, f3, f4, f5, f6, f7, f8, f9, and f10 move along the second voltage transmitting line 500, thereby preventing the second voltage transmitting line 500 from being damaged at the portion of which the width is relatively reduced.

Many characteristics of the display device according to embodiments described with reference to FIG. 1 to FIG. 10 are applicable to the display device according to the present embodiment.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
  a substrate including a display area for displaying images and a non-display area disposed around the display area;
  a plurality of connection lines disposed in the non-display area of the substrate and connected to the display area of the substrate; and
  a voltage transmitting line disposed in the non-display area of the substrate and transmitting a signal to the display area of the substrate,
  wherein the voltage transmitting line includes a first layer and a second layer overlapping each other in a depth direction that is perpendicular to a surface of the substrate,
  the first layer does not overlap the connection lines in the depth direction, and
  the second layer overlaps some of the connection lines in the depth direction.

2. The display device of claim 1, wherein
  the voltage transmitting line is disposed to surround the display area in the non-display area.

3. The display device of claim 2, wherein
  the first layer of the voltage transmitting line includes a first portion and a second portion spaced from each other.

4. The display device of claim 3, wherein
the second layer of the voltage transmitting line overlaps the first portion and the second portion, and the second layer is spaced from both the first portion and the second portion in the depth direction.

5. The display device of claim 4, wherein
a width of the second layer of the voltage transmitting line is greater than a width of the first layer of the voltage transmitting line.

6. The display device of claim 1, further comprising:
a semiconductor layer disposed in the display area;
a gate electrode overlapping the semiconductor layer;
a source electrode and a drain electrode connected to the semiconductor layer; and
a data line connected to the source electrode,
wherein the connection lines are disposed on a same layer as the gate electrode.

7. The display device of claim 6, wherein
the first layer of the voltage transmitting line is made of the same layer as the source electrode and the drain electrode.

8. The display device of claim 7, wherein
the second layer of the voltage transmitting line is disposed on the same layer as the data line.

9. The display device of claim 8, further comprising
a first voltage transmitting line disposed in the non-display area and transmitting a signal that is different from that of the voltage transmitting line to the display area of the substrate,
wherein the first voltage transmitting line is disposed on the same layer as the data line.

10. The display device of claim 9, wherein
the first voltage transmitting line includes a first sub-layer that is disposed on the same layer as the source electrode and the drain electrode and a second sub-layer that is disposed on the same layer as the data line.

11. A display device comprising:
a substrate including a display area for displaying images and a non-display area disposed around the display area;
a plurality of connection lines disposed in the non-display area of the substrate and connected to the display area of the substrate; and
a voltage transmitting line disposed in the non-display area of the substrate and transmitting a signal to the display area of the substrate,
wherein the voltage transmitting line includes a first region without overlapping the connection lines in a depth direction that is perpendicular to a surface of the substrate and a second region overlapping some of the connection lines, and
wherein the voltage transmitting line includes a first layer and a second layer disposed on the first layer, and the first layer is spaced apart from the second region in a plan view and is disposed between the plurality of connection lines and the second layer.

12. The display device of claim 11, wherein
the first layer and the second layer overlap each other in the depth direction that is perpendicular to the surface of the substrate, and
the first region includes a first sub-region in which the first layer overlaps the second layer in the depth direction and a second sub-region in which the first layer does not overlap the second layer.

13. The display device of claim 11, wherein
the first layer overlaps the second layer in the depth direction that is perpendicular to the surface of the substrate, and
the second layer is disposed in the second region.

14. The display device of claim 13, wherein
the voltage transmitting line surrounds the display area in the non-display area.

15. The display device of claim 14, wherein
the first layer of the voltage transmitting line includes a first portion and a second portion spaced from each other.

16. The display device of claim 15, wherein
the second layer of the voltage transmitting line overlaps the first portion and the second portion, and the second layer is spaced from both the first portion and the second portion in the depth direction.

17. The display device of claim 16, wherein
a width of the second layer of the voltage transmitting line is greater than a width of the first layer of the voltage transmitting line.

18. The display device of claim 11, further comprising:
a semiconductor layer disposed in the display area;
a gate electrode overlapping the semiconductor layer;
a source electrode and a drain electrode connected to the semiconductor layer; and
a data line connected to the source electrode,
wherein the connection lines are disposed on a same layer as the gate electrode.

19. The display device of claim 18, wherein
the voltage transmitting line includes a first layer and a second layer overlapping each other in the depth direction that is perpendicular to the surface of the substrate, and
the first layer of the voltage transmitting line is disposed on the same layer as the source electrode and the drain electrode.

20. The display device of claim 19, wherein
the second layer of the voltage transmitting line is disposed on the same layer as the data line.

* * * * *